(12) United States Patent
Jakobson

(10) Patent No.: US 8,957,994 B2
(45) Date of Patent: Feb. 17, 2015

(54) CDS CIRCUIT AND ANALOG-DIGITAL CONVERTER USING DITHERING, AND IMAGE SENSOR HAVING SAME

(71) Applicant: Samsung Electronics Co., Ltd., Suwon-Si, Gyeonggi-Do (KR)

(72) Inventor: Claudio Jakobson, Netanya (IS)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 8 days.

(21) Appl. No.: 13/835,065

(22) Filed: Mar. 15, 2013

(65) Prior Publication Data

US 2014/0266309 A1    Sep. 18, 2014

(51) Int. Cl.
| | |
|---|---|
| H04N 5/217 | (2011.01) |
| H04N 5/378 | (2011.01) |
| H03K 5/24 | (2006.01) |
| H03M 1/06 | (2006.01) |
| H04N 5/357 | (2011.01) |
| H03M 1/12 | (2006.01) |
| H03M 1/56 | (2006.01) |

(52) U.S. Cl.
CPC ............ *H04N 5/378* (2013.01); *H03K 5/2481* (2013.01); *H03M 1/0639* (2013.01); *H04N 5/3575* (2013.01); *H03M 1/123* (2013.01); *H03M 1/56* (2013.01)
USPC .......................................... 348/241; 348/374

(58) Field of Classification Search
CPC ........ H04N 5/335; H04N 5/378; H04N 5/155
USPC .......................................... 348/294, 374, 242
See application file for complete search history.

(56) References Cited

U.S. PATENT DOCUMENTS

| | | | |
|---|---|---|---|
| 6,831,686 | B1 | 12/2004 | Koren et al. |
| 7,145,494 | B2 | 12/2006 | Mizuguchi et al. |
| 7,301,487 | B2 | 11/2007 | Funakoshi et al. |
| 7,310,452 | B2 * | 12/2007 | Nam ............................. 348/294 |
| 7,492,401 | B2 | 2/2009 | Lim |
| 7,671,908 | B2 | 3/2010 | Lee |
| 2009/0212827 | A1 | 8/2009 | Keel et al. |
| 2010/0020211 | A1 * | 1/2010 | Inada ............................. 348/294 |
| 2011/0317036 | A1 * | 12/2011 | Lim ........................... 348/231.99 |
| 2012/0008028 | A1 * | 1/2012 | Egawa .......................... 348/300 |

FOREIGN PATENT DOCUMENTS

| | | |
|---|---|---|
| JP | 2006-020171 | 1/2006 |
| JP | 2007-074447 | 3/2007 |
| JP | 2009-218682 | 9/2009 |
| KR | 10-0790259 | 1/2008 |
| KR | 10-0866950 | 11/2008 |

* cited by examiner

*Primary Examiner* — Gevell Selby
(74) *Attorney, Agent, or Firm* — Volentine & Whitt, PLLC

(57) ABSTRACT

A correlated double sampling circuit includes a first input terminal receiving a ramp signal having first and second ramp sections, a second input terminal receiving a pixel signal, and a comparing circuit comparing the ramp signal with the pixel signal to generate an output signal, wherein the comparing circuit changes a point in time at which the output signal logically transitions during the first ramp section and the second ramp section in response to an applied dithering enable signal.

20 Claims, 16 Drawing Sheets

CDS CIRCUIT AND ANALOG-DIGITAL CONVERTER USING DITHERING, AND IMAGE SENSOR HAVING SAME

BACKGROUND

The inventive concept relates generally to image sensors. More particularly, the inventive concept relates to correlated double sampling (CDS) circuits and analog-to-digital converters (ADC) using dithering, as well as image sensors including same.

An image sensor is a device that captures an image when an optical signal (e.g., visual light) interacts with a semiconductor material. There different kinds of image sensors, but important commercial types of image sensors include complementary metal-oxide semiconductor (CMOS) image sensors and charge-coupled device (CCD) image sensors. The CMOS image sensor consumes relatively less power that the CCD image sensor, and has been widely adapted for use within mobile phones, digital cameras, and other handheld devices.

In certain conventional implementations, CMOS image sensors transform "a pixel signal" ($V_{PIX}$) that is provided in column units using a single-slope (SS), column parallel (CP), ADC in conjunction with multiple-ramp CDS circuits. A multiple-ramp CDS mechanism may operate according to a pure digital method, or a dual analog-digital method. However, in both of these methods a first ramp is used to transform a reset signal and a second ramp is used to transform an image signal. The two transformed signals are then subtracted one from the other using conventionally understood digital subtraction processes.

When a large number of signal transformations, such as the reset signal and/or image signal transformations described above, occur simultaneously, certain "common signals" shared by the SS-CP ADC (e.g., a ramp signal ($V_{RAMP}$), a power supply signal, a bias signal, and/or a ground signal) may undesirably fluctuate. In particular, since the reset signal usually has a less wide variation range than the image signal, the first ramp is likely to be most adversely influenced by fluctuation in the common signals. As a result, errors (e.g., erroneously interpreted signal transitions) may arise in the reset and/or image signals, and such errors are not effectively removed by conventional digital subtraction processes. Such residual signaling errors are manifest as signal dependent noise, degradation in the linear response, gain error, fixed pattern noise (FPN), and/or debased signal-to-noise ratio for the ultimately generated image.

SUMMARY

According to one aspect of the inventive concept, there is provided a correlated double sampling (CDS) circuit comprising; a first input terminal that receives a ramp signal comprising a first ramp section and a second ramp section, a second input terminal that receives a pixel signal, and an output terminal that provides an output signal, and a comparing circuit connected between the first and second input terminals and the output terminal, receiving a dithering enable signal, and configured to compare the ramp signal with the pixel signal to generate the output signal, wherein the comparing circuit is further configured to change a point in time at which the output signal logically transitions during the first ramp section and the second ramp section in response to the dithering enable signal.

According to one aspect of the inventive concept, there is provided an image sensor comprising; a pixel array that provides a pixel signal, a ramp signal generator that provides a ramp signal including a first ramp section and a second ramp section; and an analog-digital converter (ADC) including a plurality of correlated double sampling (CDS) circuits. Each CDS circuit comprises; a first input terminal that receives the ramp signal, a second input terminal that receives the pixel signal, and an output terminal that provides an output signal, and a comparing circuit connected between the first and second input terminals and the output terminal, receiving a dithering enable signal, and configured to compare the ramp signal with the pixel signal to generate the output signal and change a point in time at which the output signal logically transitions during the first ramp section and the second ramp section in response to the dithering enable signal.

According to one aspect of the inventive concept, there is provided a computational system comprising; a processor controlling operation of an image sensor. The image sensor comprises a pixel array that provides a pixel signal, a ramp signal generator that provides a ramp signal including a first ramp section and a second ramp section, and an analog-digital converter (ADC) including a plurality of correlated double sampling (CDS) circuits. Each CDS circuit comprises; a first input terminal that receives the ramp signal, a second input terminal that receives the pixel signal, and an output terminal that provides an output signal, and a comparing circuit connected between the first and second input terminals and the output terminal, receiving a dithering enable signal, and configured to compare the ramp signal with the pixel signal to generate the output signal and change a point in time at which the output signal logically transitions during the first ramp section and the second ramp section in response to the dithering enable signal.

BRIEF DESCRIPTION OF THE DRAWINGS

Certain embodiments of the inventive concept are illustrated in the accompanying drawings in which.

DETAILED DESCRIPTION

Figure 1:
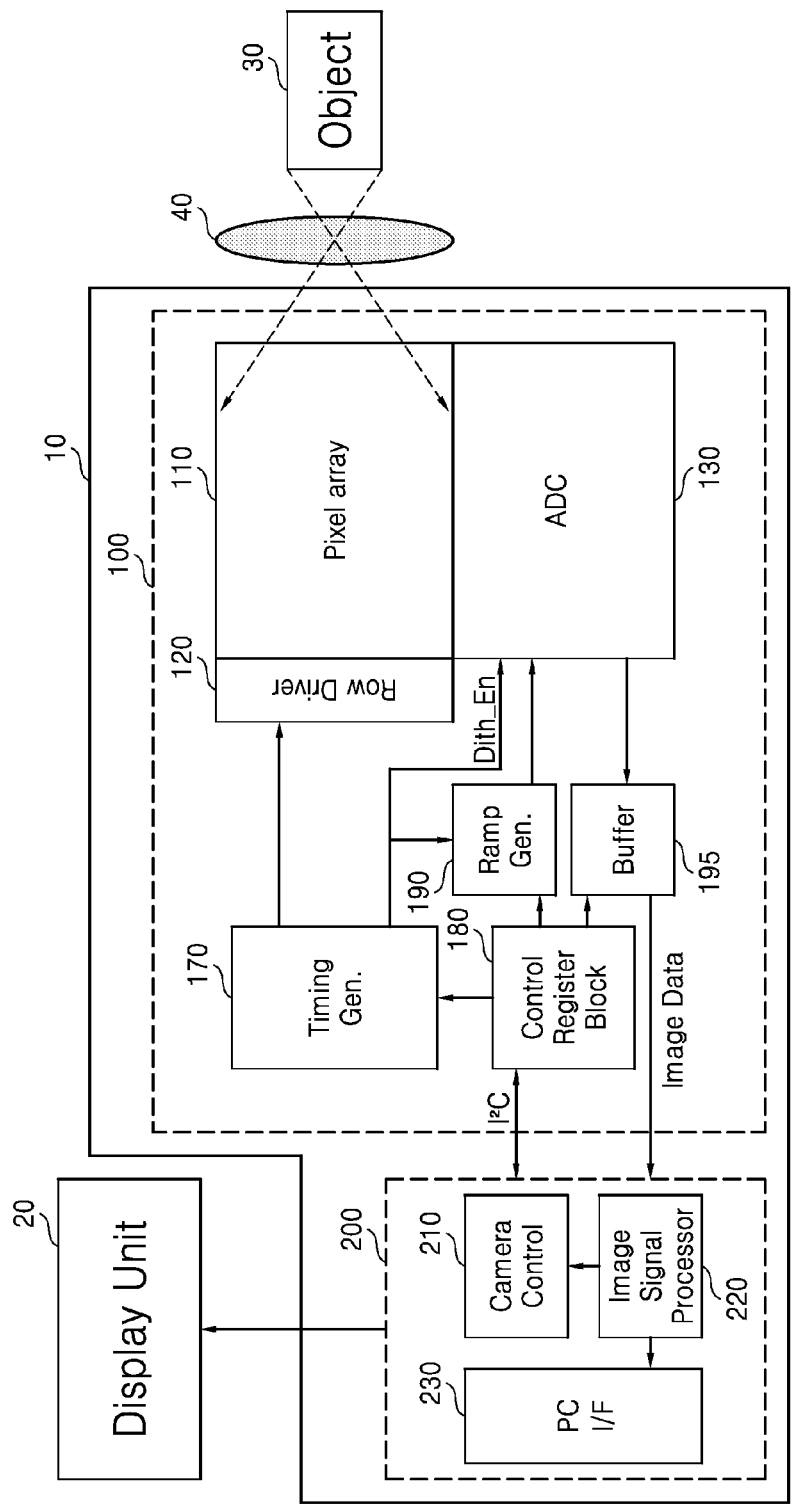
FIG. 1 is a block diagram of an image processing device including an image sensor according to an embodiment of the inventive concept.
Figure 2:
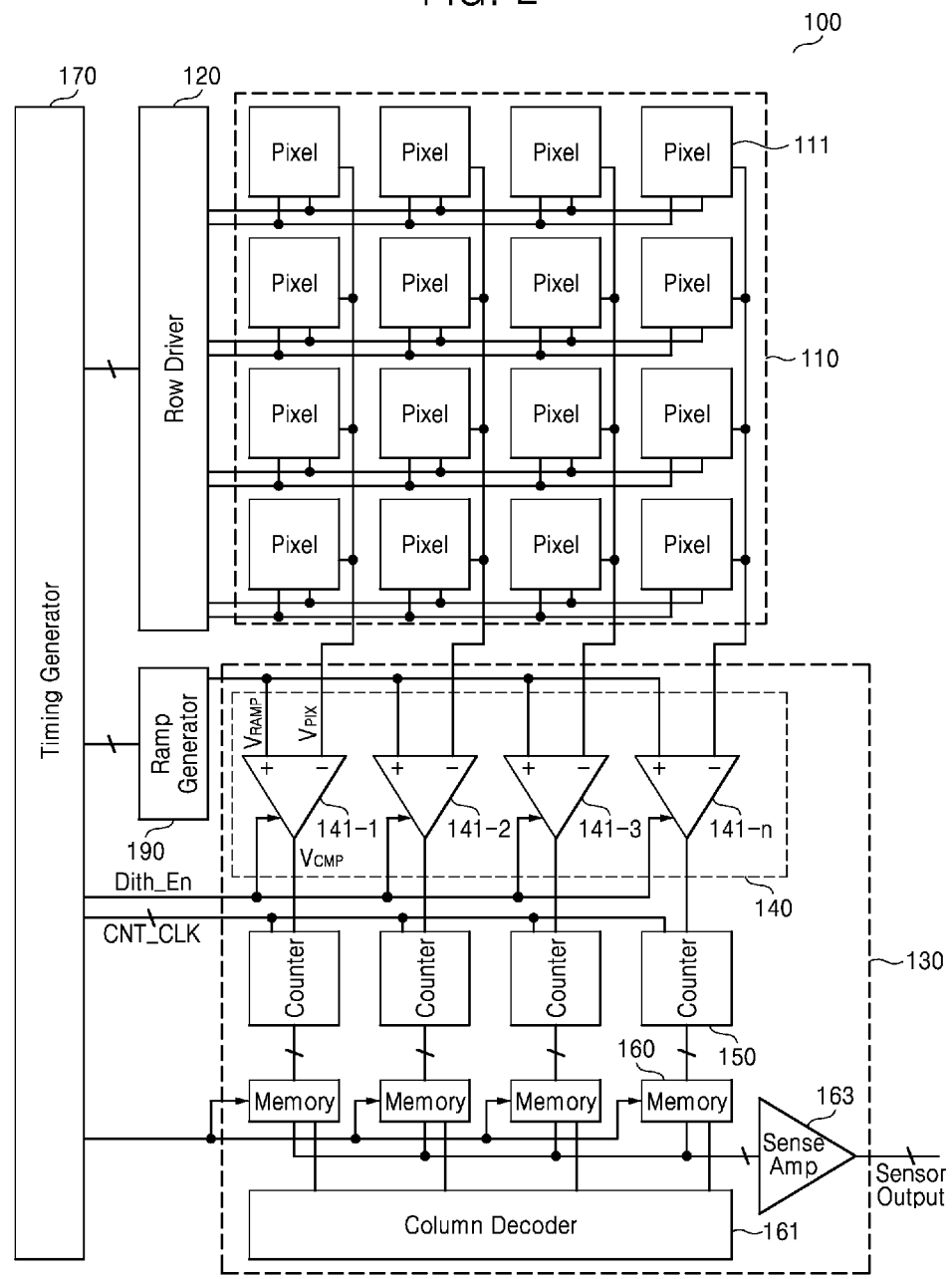
FIG. 2 is a block diagram further illustrating the image sensor of FIG. 1.

FIG. 1 is a block diagram of an image processing device 10 including an image sensor 100 according to an embodiment of the inventive concept. FIG. 2 is a block diagram further illustrating the image sensor 100 of in FIG. 1. Referring to FIGS. 1 and 2, the image processing device 10 includes the image sensor 100 and an image processor 200.

The image processing device 10 senses an image of an object 30 captured by a lens 40 under control of the image processor 200. The image processor 200 may output the image sensed by and output from the image sensor 100, to a display unit 20.

The display unit 20 may be any of various types of devices capable of outputting an image. Examples of the display unit 20 may include a computer, a mobile phone, and other image output terminals.

The image processor 200 includes a camera control 210, an image signal processor 220, and a personal computer interface (PC I/F) 230. The camera control 210 controls a control register block 180. The camera control 210 may control the image sensor 100, and particularly, the control register block 180 by using an inter-integrated circuit (I²C), but the inventive concept is not limited thereto.

The image signal processor 220 receives image data that is an output signal of a buffer 195, processes the image data such that the image data may be easily seen by human eyes, and then outputs the processed image data to the display unit 20 via the PC I/F 230.

Although FIG. 1 illustrates the image signal processor 220 as being included within the image processor 200, the location of the image signal processor 220 may vary with other embodiments of the inventive concept. For example, the image signal processor 220 may be included in the image sensor 100.

The image sensor 100 includes a pixel array 110, a row driver 120, an analog-digital converter (ADC) 130, a timing generator 170, the control register block 180, a ramp signal generator 190 that generates a ramp signal $V_{RAMP}$, and the buffer 195. The pixel array 110 transforms an optical image signal into a corresponding electrical pixel signal using a plurality of pixels 111.

The plurality of pixels 111 may be embodied as one or more of red pixels that transform red spectrum light, green pixels that transform green spectrum light, and/or blue pixels that transform blue spectrum light. Alternately, the plurality of pixels 111 may be embodied as cyan pixels, magenta pixels, and yellow pixels.

The plurality of pixels 111 may be implemented using a collection of photo diodes and/or pinned photo diodes, for example.

The timing generator 170 may be used to control operations of the row driver 120, the ADC 130, and the ramp signal generator 190. The timing generator 170 may be used to generate a dithering enable signal (Dith_En) that is provided to a plurality of correlated double sampling (CDS) circuits 141-1 to 141-n included in the ADC 130.

The control register block 180 may be used to control operations of the ramp signal generator 190, the timing generator 170, and the buffer 195. In such embodiments, the control register block 180 will operate under control of the camera control 210. The camera control 210 may be embodied by hardware and/or software components.

The ramp signal generator 190 may be used to generate the ramp signal $V_{RAMP}$ under control of the timing generator 170. According to certain embodiments of the inventive concept, the ramp signal $V_{RAMP}$ may ramped up and/or ramp down.

The row driver 120 may be used to drive the pixel array 110 in defined row units. For example, the row driver 120 may generate a row selection signal. In other words, the row driver 120 may decode a row control signal, e.g., an address signal, which is generated by the timing generator 170, and select at least one row line among row lines of the pixel array 110 according to the decoded row control signal. Also, the pixel array 110 may receive a pixel signal $V_{PIX}$ from a row selected according to the row selection signal provide by the row driver 120, and then output the pixel signal $V_{PIX}$ to the ADC 130. In the illustrated embodiments, it is assumed that the pixel signal $V_{PIX}$ includes a reset signal and an image signal.

The ADC 130 may be used compare the pixel signal $V_{PIX}$ with the ramp signal $V_{RAMP}$ provided by the ramp signal generator 190 in order to output a comparison result signal. The comparison result signal is then counted, and the counted result is provide to the buffer 195. In certain embodiments, the ADC 130 may be embodied as a single-slope (SS), column parallel (CP), ADC. In the illustrated embodiment of FIG. 2, the ADC 130 includes a CDS block 140 including a plurality of CDS circuits 141-1 to 141-n, a plurality of counters 150, a plurality of memories 160, a column decoder 161, and a sense amplifier 163.

Each of the CDS circuits 141-1 to 141-n may be used to perform correlated double sampling of the pixel signal $V_{PIX}$ provided by respective unit pixels 111 as connected to one of column lines in the pixel array 110. According to certain embodiments of the inventive concept, the CDS circuits 141-1 to 141-n may be embodied as either dual CDS circuits or digital CDS circuits as will be described in some additional detail hereafter with reference to FIG. 3.

In FIG. 2, the counters 150 are connected to respective output terminals of the CDS circuits 141-1 to 141-n, and count output signals $V_{CMP}$ of the CDS circuits 141-1 to 141-n and output digital signals, according to a clock signal CNT_CLK received from the timing generator 170. The counters 150 may be embodied as up/down counters or bit-wise inversion counters.

The memories 160 may be used to respectively receive and store the digital signals from the counters 150 according to a control signal generated by the timing generator 170. The memories 160 may be embodied as static random access memories (SRAMs) and/or dynamic random access memories (DRAMs).

A digital signal is output from at least one of the memories 160 under the control of the column decoder 161. The digital signal is amplified by the sense amplifier 163 and provided as image data. The buffer 195 temporarily stores image data output from the ADC 130, and outputs the image data to the image processor 200 under control of the control register block 180.

Figure 3A:
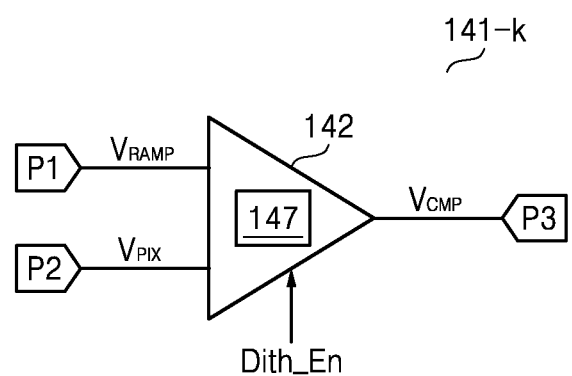
FIG. 3A is a circuit diagram of a correlated double sampling (CDS) circuit according to an embodiment of the inventive concept.
Figure 3B:
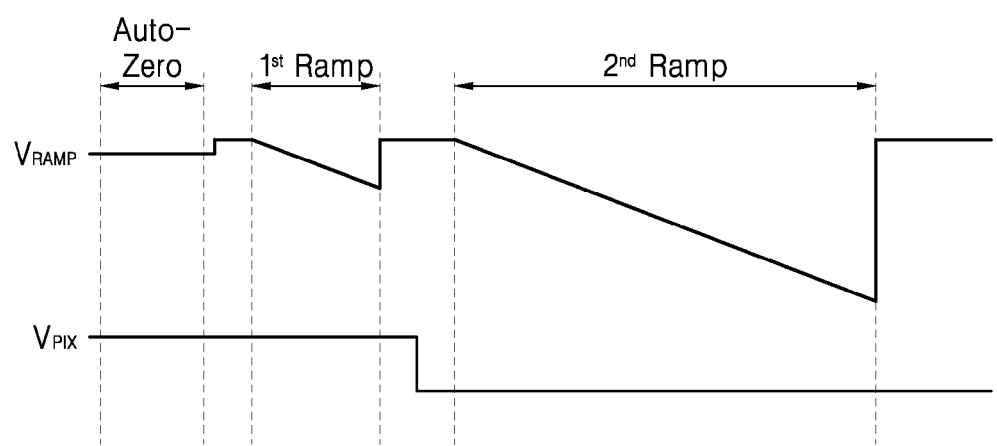
FIG. 3B is a simple timing diagram for a pixel signal and a ramp signal having an assumed relationship within the context of certain embodiments of the inventive concept.

FIG. 3A is a block diagram of one exemplary CDS circuit 141-k according to an embodiment of the inventive concept, and FIG. 3B is a related timing diagram showing an assumed relationship between the pixel signal $V_{PIX}$ and ramp signal $V_{RAMP}$ according to certain embodiments of the inventive concept.

Referring to FIGS. 2 and 3A, the CDS circuit 141-k includes a first input terminal P1, a second input terminal P2, an output terminal P3, and a comparing circuit 142.

The first input terminal P1 receives the ramp signal $V_{RAMP}$ from the ramp signal generator 190. As illustrated in FIG. 3B, the ramp signal $V_{RAMP}$ includes a first ramp section and a second ramp section. The first ramp section is used to transform the reset signal and the second ramp section is used to transform the image signal. The ramp signal $V_{RAMP}$ as illustrated in FIG. 3B further includes an auto-zero section.

The second input terminal P2 receives a particular pixel signal $V_{PIX}$ from one of the plurality of pixels 111 of the pixel array 110. The pixel signal $V_{PIX}$ includes a reset signal and an image signal.

The comparing circuit 142 is connected between the first input terminal P1/second input terminal P2 and the output terminal P3, and compares the ramp signal $V_{RAMP}$ and the pixel signal $V_{PIX}$ in order to output an output signal $V_{CMP}$ apparent at the output terminal P3 that varies with the comparison of the ramp signal $V_{RAMP}$ and the pixel signal $V_{PIX}$. The comparing circuit 142 may be used to change the point of time at which a logic level of the output signal $V_{CMP}$ changes between the first ramp section and the second ramp section in accordance with the dithering enable signal (Dith_En) applied to the comparing circuit 142. For example, the comparing circuit 142 may include an offset controller 147 that is configured to change the logic level of the output signal $V_{CMP}$ according to the dithering enable signal Dith_En.

Figure 4A:
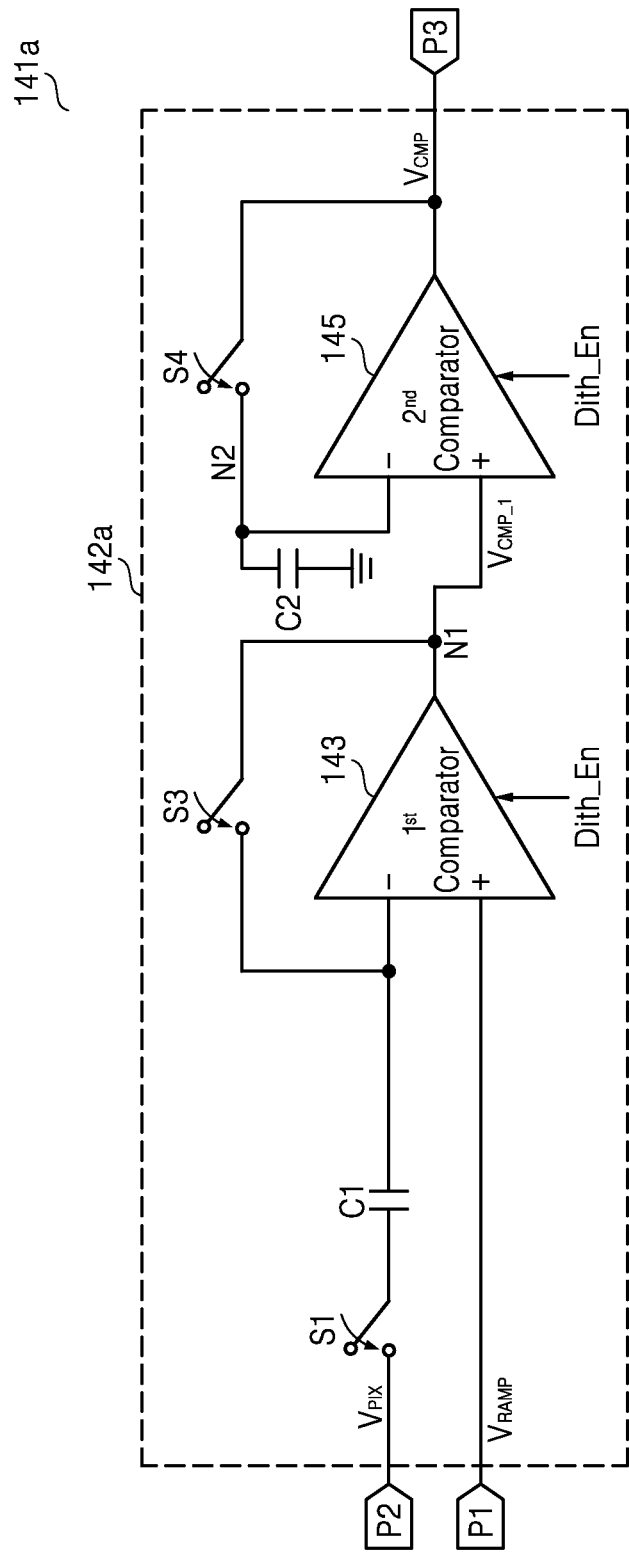
FIG. 4A is a circuit diagram of one possible CDS circuit that may be used in certain embodiments of the inventive concept.

FIG. 4A is a circuit diagram illustrating another CDS circuit according to an embodiment of the inventive concept. Referring to FIGS. 3 and 4A, the CDS circuit 141-k of FIG. 3A may be embodied as a dual CDS circuit 141a like the one illustrated in FIG. 4A. The dual CDS circuit 141a includes a first input terminal P1, a second input terminal P2, an output terminal P3, and a comparing circuit 142a. The comparing circuit 142a includes a first comparator 143, a second comparator 145, a first capacitor C1, a second capacitor C2, a first switch S3, a second switch S4, and a third switch S1.

The first comparator 143 includes a first non-inversion input terminal (+) connected to the first input terminal P1, a first inversion input terminal (−) connected to the second input terminal P2, and a first output terminal connected to a first node N1. The first comparator 143 compares the ramp signal $V_{RAMP}$ and the pixel signal $V_{PIX}$, generates a first comparison signal $V_{CMP\_1}$ based on a result of the comparing, and outputs the first comparison signal $V_{CMP\_1}$ to the first node N1.

The second comparator 145 includes a second non-inversion input terminal (+) connected to the first node N1, a second inversion input terminal (−) connected to a second node N2, and a second output terminal connected to the output terminal P3. The second comparator 145 outputs a second comparison signal $V_{CMP\_2}$ obtained by amplifying the first comparison signal $V_{CMP\_1}$, as the output signal $V_{CMP}$.

The first capacitor C1 is connected between the second input terminal P2 and the first inversion input terminal (−), and stores the difference between voltages of the ramp signal $V_{RAMP}$ and the pixel signal $V_{PIX}$ in the auto-zero section. The first capacitor C1 may be embodied as a metal-insulator-metal (MIM) capacitor.

The second capacitor C2 is connected between the second node N2 connected to the second inversion input terminal (−) and a ground voltage source, and stores an auto-zero voltage in the auto-zero section. During the auto-zero section, the ramp signal $V_{RAMP}$ has a constant voltage. The term "auto-zero voltage" means a voltage of the ramp signal $V_{RAMP}$ during the auto-zero section of the ramp signal $V_{RAMP}$.

At least one of the first comparator 143 and the second comparator 145 may include the offset controller 147 controlled according to a digital method. The offset controller 147 may be embodied to supply constant current or voltage to a node in the first comparator 143 or the second comparator 145. Otherwise, the offset controller 147 may be embodied to short-circuit or open transistors and capacitors included in the first comparator 143 and the second comparator 145, as will be described in some additional detail with reference to FIGS. 7, 8, 9 and 10.

The first switch S3 is connected between the first inversion input terminal (−) and the first node N1, and is short-circuited during the auto-zero section to feed back the first comparison signal $V_{CMP\_1}$ output from the first comparator 143 to the first inversion input terminal (−).

The second switch S4 is connected between the second node N2 and an output terminal of the second comparator 145, and is short-circuited during the auto-zero section to feed back the output signal $V_{CMP}$ output from the second comparator 145 to the second node N2.

The third switch S1 is connected in series to the first capacitor C1, and controls whether or not the pixel signal $V_{PIX}$ is supplied to the first comparator 143.

Figure 4B:
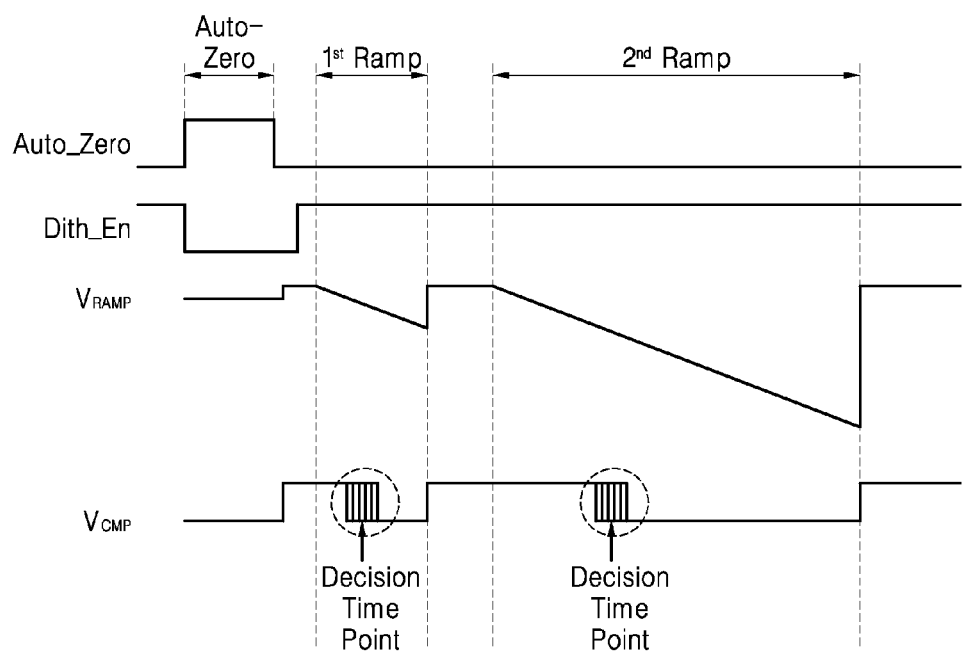
FIG. 4B is a related timing diagram for the CDS circuit of FIG. 4A.

FIG. 4B is a related timing diagram for the dual CDS circuit 141a of FIG. 4A. Referring to FIGS. 4A and 4B, the ramp signal $V_{RAMP}$ includes an auto-zero section, a first ramp section, and a second ramp section.

During the auto-zero section, the first switch S3 and the second switch S4 are closed (short-circuited). Under these conditions, the dithering enable signal (Dith_En) is deactivated (e.g., is logically "low"). As a result, the first capacitor C1 will store an offset difference between the ramp signal $V_{RAMP}$ and the pixel signal $V_{PIX}$, and the second capacitor C2 will store a value of the ramp signal $V_{RAMP}$ (i.e., an auto-zero voltage).

During the first and second ramp sections, the first switch S3 and the second switch S4 are opened. Under these conditions, the dithering enable signal is activated (e.g., is logically "high").

As a result, the first comparator 143 compares the ramp signal $V_{RAMP}$ and pixel signal $V_{PIX}$, and changes a first comparison signal $V_{CMP\_1}$ from high to low when the value of the ramp signal $V_{RAMP}$ becomes equal to a result of adding an offset to a value of the pixel signal $V_{PIX}$. The second comparator 145 outputs an output signal $V_{CMP}$ obtained by amplifying the first comparison signal $V_{CMP\_1}$.

Under these conditions, a "decision time point" at which the first comparison signal $V_{CMP\_1}$ and the output signal $V_{CMP}$ transition from high to low may be advanced or delayed based on the offset added in accordance with the dithering enable signal (Dith_En), as will be described hereafter in some additional detail with reference to FIGS. 6A and 6B.

FIG. 4B illustrates a case where the dithering enable signal (Dith_En) is activated high during the first and second ramp sections but the inventive concept is not limited thereto. According to other embodiments, the dithering enable signal (Dith_En) may be activated to logic high during the auto-zero section, and may be deactivated to low during the first and second ramp sections. In this case, during the auto-zero section, the offset controller 147 may operate to change a voltage stored in the first capacitor C1 or the second capacitor C2. As the voltage stored in the first capacitor C1 or the second capacitor C2 is changed, an offset may be added to the output signal $V_{CMP}$ in the first and second ramp sections. However, since the offset is added to the output signal $V_{CMP}$ only during the first and second ramp sections following the auto-zero section, the offset is not influenced by an auto-zero function. In other words, the auto-zero function may be variously embodied.

Figure 5A:
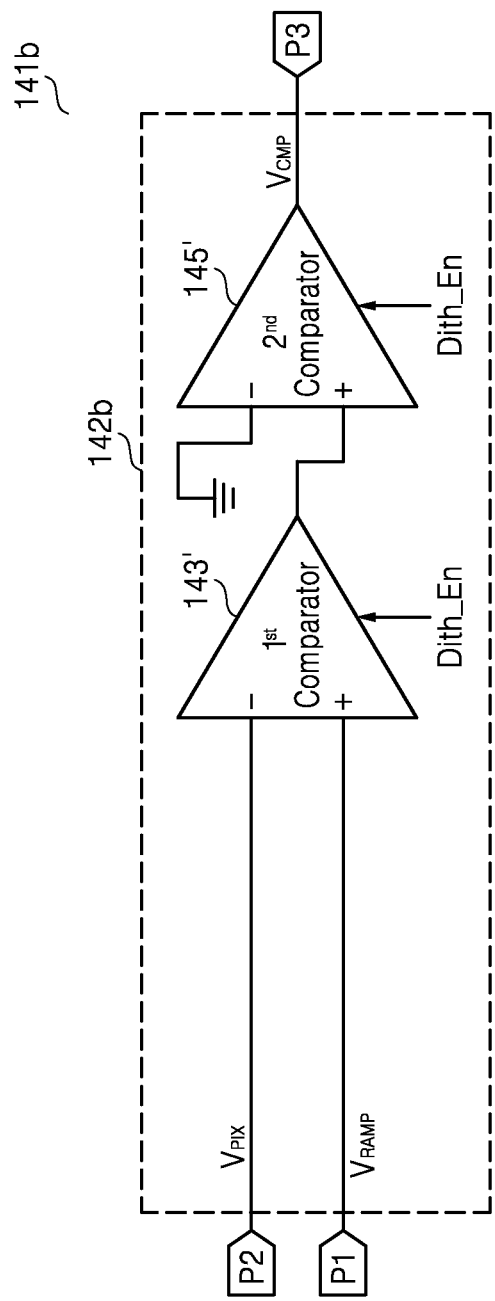
FIG. 5A is a circuit diagram of another possible CDS circuit that may be used in certain embodiments of the inventive concept.

FIG. 5A is a circuit diagram of a digital CDS circuit 141b that may be used in another implementation of the CDS circuit 141-k of FIG. 3A according to certain embodiments of the inventive concept. The digital CDS circuit 141b is the same as the dual CDS circuit 140-1 except for certain structural differences that will be described.

The digital CDS circuit 141b includes a first input terminal P1, a second input terminal P2, an output terminal P3, and a comparing circuit 142b. The digital CDS circuit 141b receives a DC-coupled pixel signal $V_{PIX}$, and a ramp signal $V_{RAMP}$ that does not include an auto-zero section. The ramp signal $V_{RAMP}$ does not include an initial offset. According to this particular embodiment of the inventive concept, a first comparator 143' may be embodied as a pre-amplifier providing a minimal gain, whereas a second comparator 145' may be embodied as an operational trans-conductance amplifier providing most of the overall gain.

The digital CDS circuit 141b does not include the first and second capacitors C1 and C2 and the switches S1, S3, and S4, as compared with the dual CDS circuit 141a of FIG. 4A. In the digital CDS circuit 141b of FIG. 5A, parts corresponding to both ends of the first capacitor and second capacitors C1 and C2 illustrated in FIG. 4A are short-circuited. Thus, a ground voltage is applied to a second inversion input terminal (−) of the second comparator 145'. In the digital CDS circuit 141b of FIG. 5A, parts corresponding to both ends of the third switch S1 illustrated in FIG. 4A are short-circuited, and parts corresponding to both ends of the first switch S3 and the second switch S4 illustrated in FIG. 4A are open.

Figure 5B:
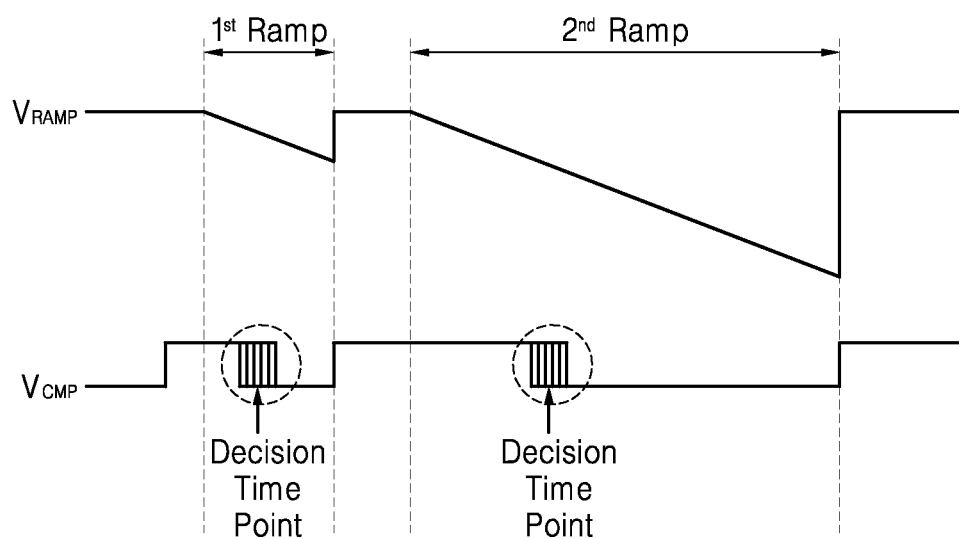
FIG. 5B is a related timing diagram for the CDS circuit of FIG. 5A.

FIG. 5B is a related timing diagram for the digital CDS circuit 141b of FIG. 5A. Referring to FIGS. 5A and 5B, a ramp signal $V_{RAMP}$ includes a first ramp section and a second ramp section.

A first comparator 143' compares a pixel signal $V_{PIX}$ with the ramp signal $V_{RAMP}$ in the first and second ramp sections, and changes a first comparison signal $V_{CMP\_1}$ from high to low when a value of the ramp signal $V_{RAMP}$ becomes equal to a result of adding an offset to a value of the pixel signal $V_{PIX}$. A second comparator 145' amplifies the first comparison signal $V_{CMP\_1}$ and outputs an output signal $V_{CMP}$.

In this case, the decision time point when the first comparison signal $V_{CMP\_1}$ and the output signal $V_{CMP}$ changes from high to low may be advanced or delayed based on an offset added according to a dithering enable signal (Dith_En) as will be described in some additional detail with reference to FIGS. 6A and 6B.

Figure 6A:
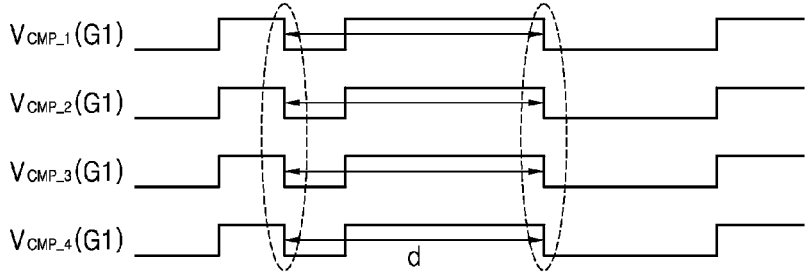
FIG. 6A is a timing diagram for output signals when the CDS circuit of FIG. 3A does not include an offset controller.
Figure 6B:
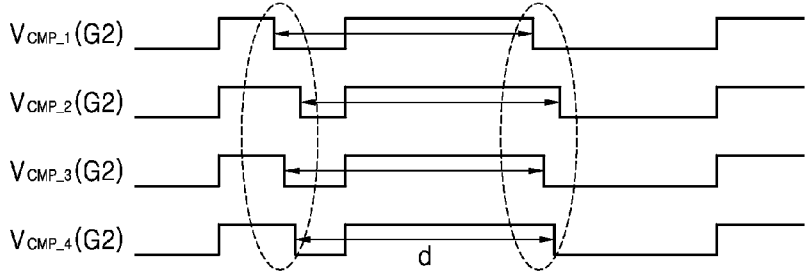
FIG. 6B is a timing diagram for output signals when the CDS circuit of FIG. 3A includes an offset controller consistent with embodiments of the inventive concept.

FIG. 6A is a timing diagram illustrating output signals for the CDS circuit 141-k of FIG. 3A that does not include the offset controller 147, and FIG. 6B is a timing diagram illustrating the output signals for the CDS circuit 141-k of FIG. 3A including the offset controller 147.

Referring to FIGS. 3A and 6A, it is assumed that the CDS circuit 141-k does not include the offset controller 147 and that, therefore, the points in time when the logic level of an output signal $V_{CMP}$ changes are static (not variable). It is further assumed that the pixel data from adjacent columns in a pixel array (not shown) have the same value. Since CDS circuits disposed in columns in the pixel array share the same ramp signal, output signals $V_{cmp\_1}(G1)$, $V_{CMP\_2}(G1)$, $V_{CMP\_3}(G1)$, and $V_{CMP\_4}(G1)$ for the CDS circuits simultaneously change from high to low when the same pixel signal is supplied to the CDS circuits. Thus, a fluctuation may occur in common signals, e.g., the ramp signal.

In contrast, referring to FIGS. 3A and 6B, the offset controller 147 varies the points in time when logic levels of output signals $V_{CMP\_1}(G2)$, $V_{CMP\_2}(G2)$, $V_{CMP\_3}(G2)$, and $V_{CMP\_4}(G2)$ of CDS circuits change, thereby removing or dramatically reducing the possibility of fluctuation in common signals. This approach to changing the identified points in time will hereafter be referred to as a "dithering operation".

It is also assumed that offsets that are respectively added in a first ramp section and a second ramp section are the same. With the foregoing assumptions in place and referring to FIGS. 6A and 6B, it should be noted that a timing duration "d" between points in time when the logic levels of the output signals change during the first ramp section, and points in time when the logic levels of the output signals change during the second ramp section are maintained constant. And as a result, the added offsets may be effectively removed using a digital subtraction process.

Points in time when the logic levels of the output signals $V_{CMP\_1}(G2)$, $V_{CMP\_2}(G2)$, $V_{CMP\_3}(G2)$, and $V_{CMP\_4}(G2)$ corresponding to adjacent columns in a pixel array (not shown) respectively change may be controlled such that they are different one from the other. According to certain embodiments of the inventive concept, the points in time may be changed according to random noise. According to other embodiments of the inventive concept, the points in time may be changed according to one of a plurality of predetermined offsets.

Figure 7:
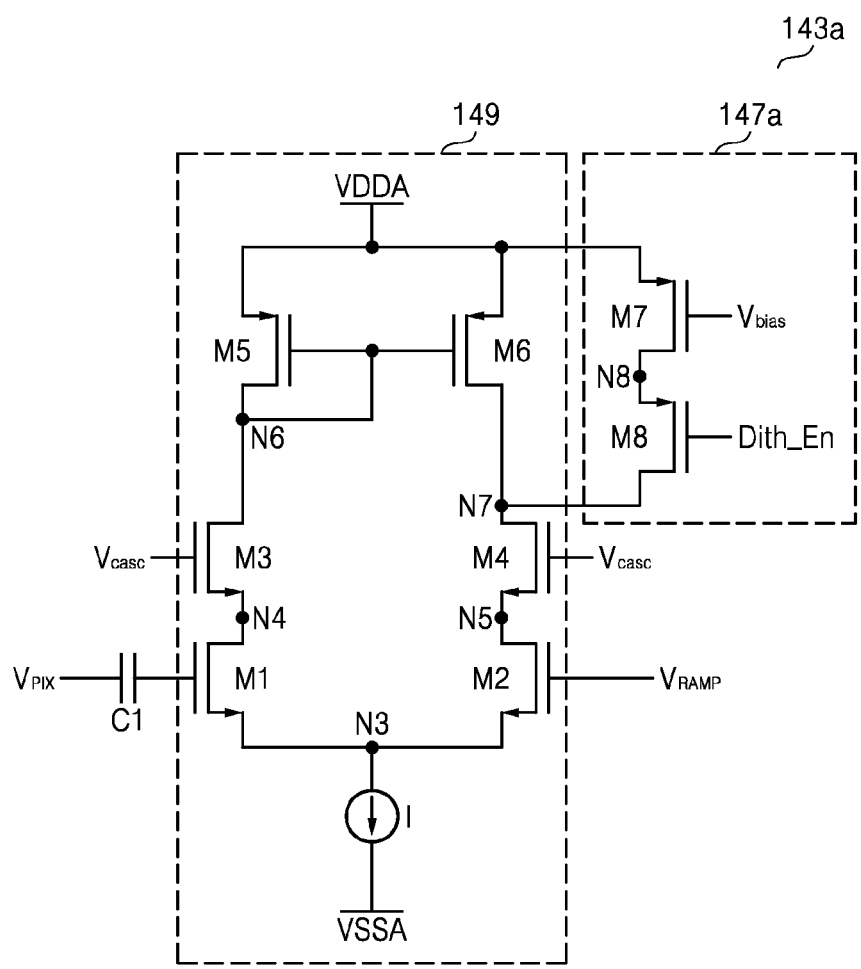
FIG. 7 is a circuit diagram of a first comparator including an offset controller according to an embodiment of the inventive concept.

FIG. 7 is a circuit diagram further illustrating in one example a first comparator 143a including an offset controller 147a according to an embodiment of the inventive concept. Referring to FIG. 7, the first comparator 143a may include a differential amplifier 149 and the offset controller 147a.

The differential amplifier 149 includes a first power supply line, a second power supply line, a current source I, a first transistor M1, a second transistor M2, a third transistor M3, a fourth transistor M4, a fifth transistor M5, and a sixth transistor M6.

A first reference voltage VSSA is applied via the first power supply line. A second reference voltage VDDA is applied via the second power supply line. The current source I is connected between the first power supply line and a third node N3. The transistor M1 is connected between the third node N3 and a fourth node N4, and has a gate connected to the first inversion input terminal (−) or the second inversion input terminal (−) illustrated in FIG. 4A. The second transistor M2 is connected between the third node N3 and a fifth node N5, and has a gate connected to the first non-inversion input terminal (+) or the second non-inversion input terminal (+) illustrated in FIG. 4A. The third transistor M3 is connected between the fourth node N4 and a sixth node N6, and has a gate to which a cascode reference voltage $V_{CASC}$ is applied. The fourth transistor M4 is connected between the fifth node N5 and a seventh node N7, and has a gate to which the cascode reference voltage $V_{CASC}$ is applied. The fifth transistor M5 is connected between the sixth node N6 and the second power supply line, and has a gate connected to the sixth node N6. The sixth transistor M6 is connected between the seventh node N7 and the second power supply line and has a gate connected to the sixth node N6.

The offset controller 147a includes a first offset transistor M7 and a second offset transistor M8 that are connected in series between the second power supply line and the seventh node N7.

The first offset transistor M7 is connected between the second power supply line and an eighth node N8, and has a gate to which a bias voltage $V_{bias}$ is applied. The second offset transistor M8 is connected between the eighth node N8 and the seventh node N7, and has a gate to which a dithering enable signal (Dith_En) is supplied.

The first offset transistor M7 functions as a fixed current source, and the second offset transistor M8 functions as a switch according to the dithering enable signal Dith_En. The second offset transistor M8 may be short-circuited in an auto-zero section and may be open in the other sections according to the dithering enable signal Dith_En, or vice versa.

A decision time point of the comparator 143a varies according to an amount of current in the first offset transistor M7. In other words, the more the amount of offset current, the later the decision time point is. Accordingly, the sizes of the first offset transistors M7 included in a plurality of the comparators 143a in columns in a pixel array (not shown) are controlled to be different, thereby controlling points in time when logic levels of output signals $V_{CMP}$ change to be different.

Figure 8:
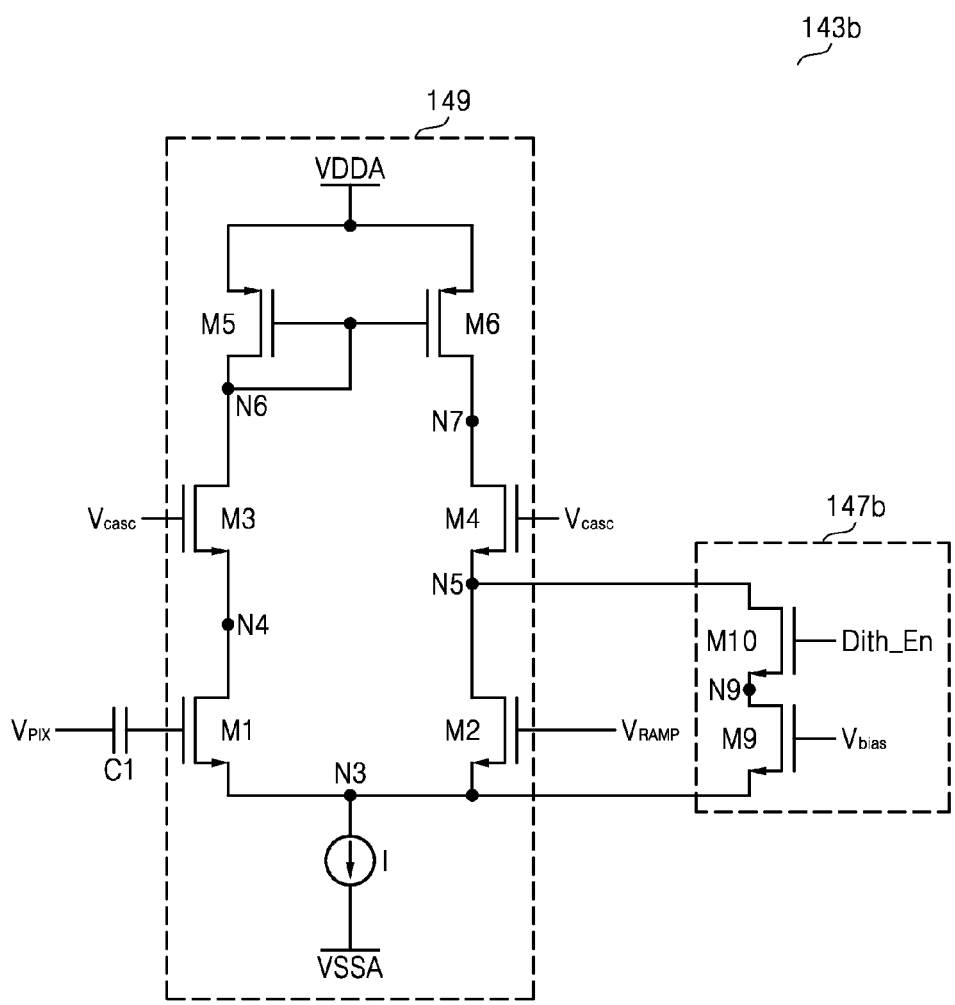
FIG. 8 is a circuit diagram of a first comparator including an offset controller according to another embodiment of the inventive concept.

FIG. 8 is a circuit diagram illustrating in another example a first comparator 143b including an offset controller 147b according to an embodiment of the inventive concept. Referring to FIG. 8, the first comparator 143b includes a differential amplifier 149 and an offset controller 147b. The differential amplifier 149 has the same structure as that of FIG. 7.

The offset controller 147b includes a third offset transistor M9 and a fourth offset transistor M10 that are connected in series between both ends of a second transistor M2, i.e., between a fifth node N5 and a third node N3.

The third offset transistor M9 is connected between the third node N3 and a ninth node N9, and has a gate to which a bias voltage $V_{bias}$ is applied. The fourth offset transistor M10 is connected between the fifth node N5 and the ninth node N9, and has a gate to which a dithering enable signal (Dith_En) is supplied.

In FIG. 8, the offset controller 147 is illustrated as being connected between the both ends of the second transistor M2, i.e., between the fifth node N5 and the third node N3, but the inventive concept is not limited thereto, and the offset controller 147 may be connected between a seventh node N7 and the third node N3, between the seventh node N7 and a first power supply line, or between the fifth node N5 and the first power supply line.

A decision time point of the comparator 143b varies in accordance with an amount of current in the third offset transistor M9. That is, the more the amount of offset current, the earlier the decision time point occurs. Thus, the respective decision time points for a plurality of the comparators 143b arranged in columns in a pixel array (not shown) may be controlled by differently defining the respective sizes of the third offset transistors M9 included in the respective comparators 143b.

Figure 9:
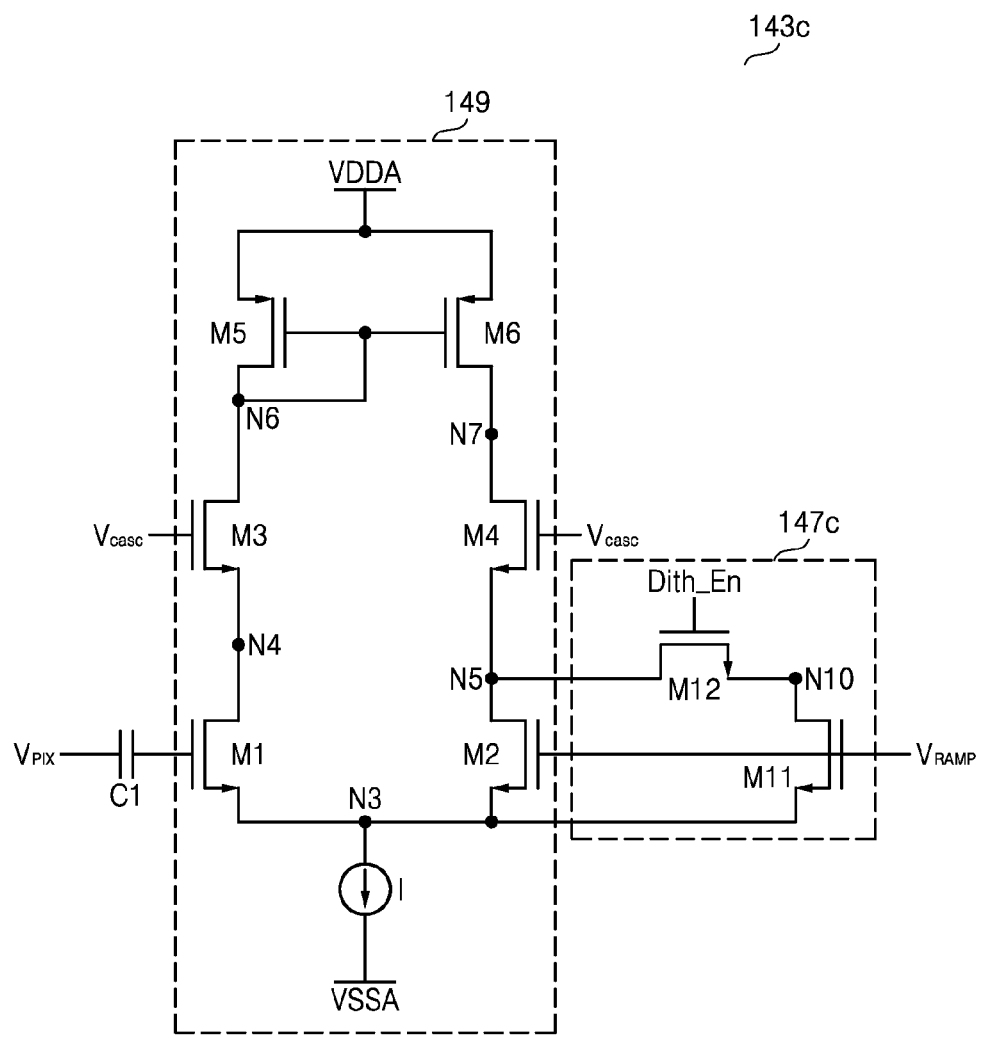
FIG. 9 is a circuit diagram of a first comparator including an offset controller according to still another embodiment of the inventive concept.

FIG. 9 is a circuit diagram illustrating in another example a first comparator 143c including an offset controller 147c according to an embodiment of the inventive concept. Referring to FIG. 9, the first comparator 143c includes a differential amplifier 149 and the offset controller 147c. The differential amplifier 149 has the same structure as that illustrated in FIG. 7.

The offset controller 147c includes a fifth offset transistor M11 and a sixth offset transistor M12 connected in series between both ends of a second transistor M2, i.e., between a fifth node N5 and a third node N3.

The fifth offset transistor M11 is connected between the third node N3 and a tenth node N10, and has a gate connected to the first non-inversion input terminal (+) or the second non-inversion input terminal (+) of FIG. 4A. The sixth offset transistor M12 is connected between the fifth node N5 and the tenth node N10, and has a gate to which a dithering enable signal (Dith_En) is supplied.

Figure 10:
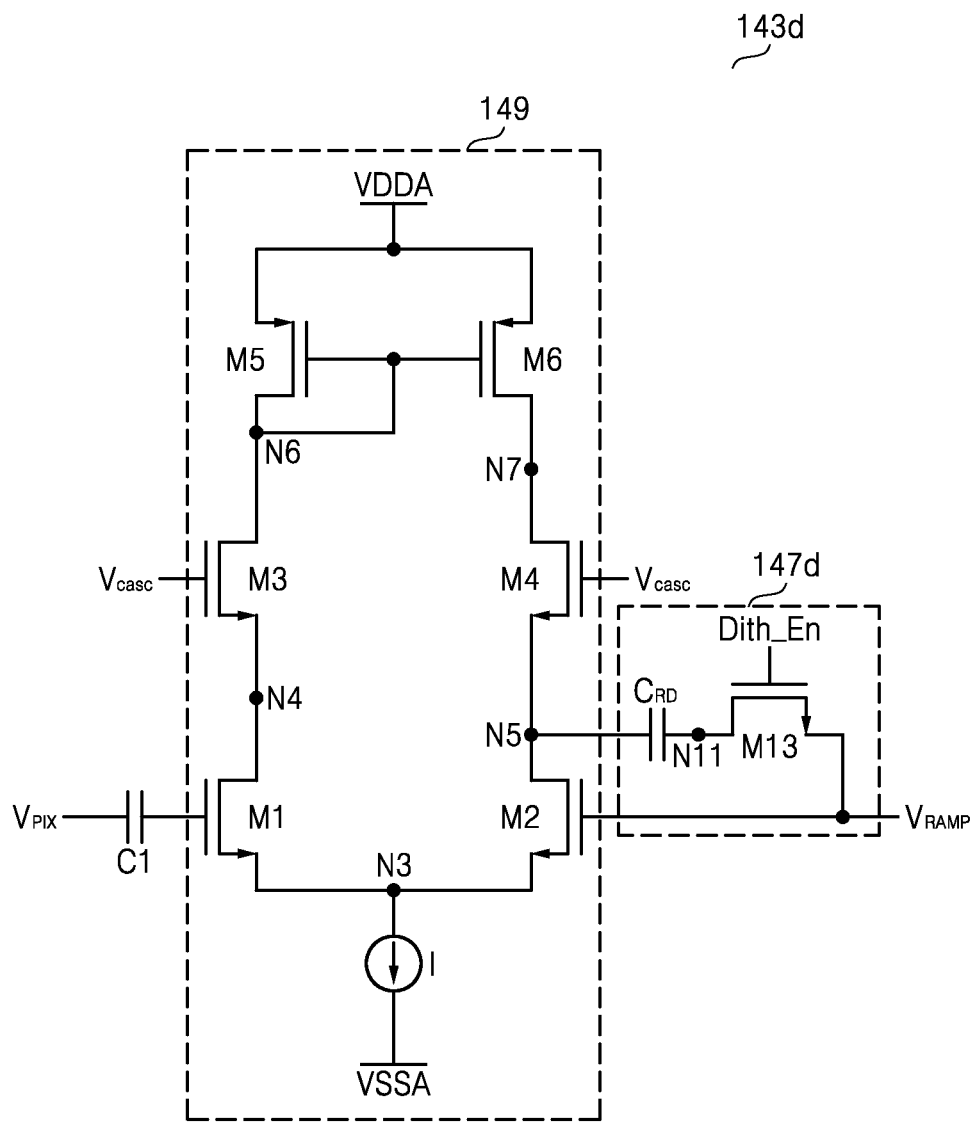
FIG. 10 is a circuit diagram of a first comparator including an offset controller according to yet another embodiment of the inventive concept.

FIG. 10 is a circuit diagram illustrating in yet another example a first comparator 143d including an offset controller 147d according to an embodiment of the inventive concept. Referring to FIG. 10, the first comparator 143d includes a differential amplifier 149 and the offset controller 147d. The differential amplifier 149 has the same structure as that illustrated in FIG. 7.

The offset controller 147d includes a seventh offset transistor M13 and an offset capacitor $C_{RD}$ connected in series between a gate of a second transistor M2 and a fifth node N5.

The seventh offset transistor M13 is connected between the gate of the second transistor M2 and an eleventh N11, and has a gate to which a dithering enable signal (Dith_En) is supplied. The offset capacitor $C_{RD}$ is connected between the fifth node N5 and the eleventh node N11, and redistributes electric charges in the fifth node N5 and the gate of the second transistor M2.

Although variously described with reference to FIGS. 7, 8, 9 and 10, the first comparator 143 may be embodied as the differential amplifier 149 and as further including the offset controller 147. However, the second comparator 145 may be embodied as the circuit illustrated in one of FIGS. 7 to 10 and the offset controller 147 may be included only in the second comparator 145. Otherwise, each of the first comparator 143 and the second comparator 145 may be embodied as one of the circuits illustrated in FIGS. 7, 8, 9 and 10. When the comparing circuit 142 further includes at least one third comparator (not shown) to increase a gain, the third comparator may be embodied as one of the circuits illustrated in FIGS. 7, 8, 9 and 10 and the offset controller 147 may be included only in the third comparator.

Figure 11:
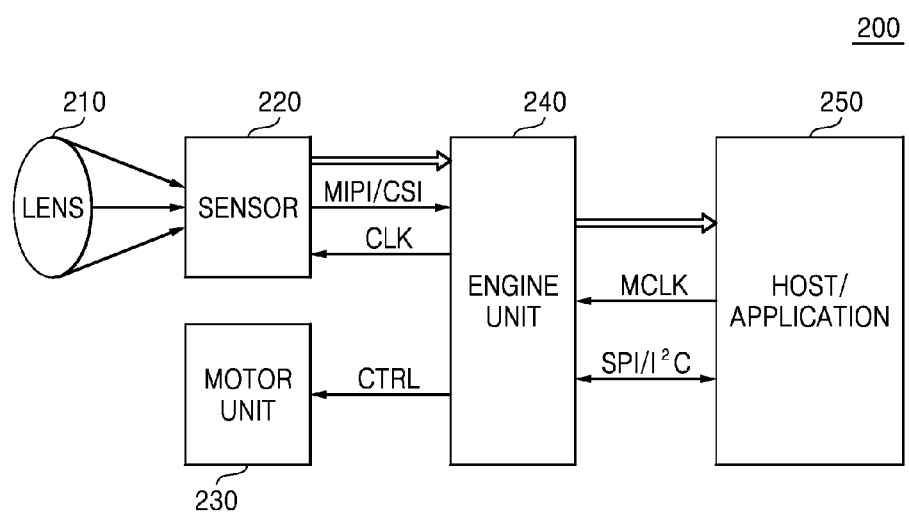
FIG. 11 is a block diagram of a camera system according to an embodiment of the inventive concept.

FIG. 11 is a block diagram of a camera system 200 (e.g., a digital camera) according to an embodiment of the inventive concept.

Referring to FIG. 11, the camera system 200 includes a lens 210, an image sensor 220, a motor unit 230, and an engine unit 240. The image sensor 220 may be an image sensor as described above with reference to FIGS. 1 through 10.

The lens 210 concentrates incident light on a light-receiving region, e.g., a photo diode, of the image sensor 220. The image sensor 220 generates image data based on the light incident thereon via the lens 210. The image sensor 220 may provide the image data, based on a clock signal CLK. According to an embodiment of the inventive concept, the image sensor 220 may interface with the engine unit 240 via a mobile industry processor interface (MIPI) and/or a camera serial interface (CSI).

The motor unit 230 may control focusing of the lens 210 or perform shuttering of the lens 210, according to a control signal CTRL received from the engine unit 240.

The engine unit 240 controls the image sensor 220 and the motor unit 230. Also, the engine unit 240 may generate YUV data containing information about the distance between the camera system 200 and an object that is to be photographed, a luminance component, the difference between values of the luminance component and a blue component, and the difference between values of the luminance component and a red component, based on information about a distance and/or image data received from the image sensor 220, or may generate compressed data, e.g., Joint Photography Experts Group (JPEG) data. The engine unit 240 may be connected to a host/application 250, and provide the host/application 250 with the YUV data or the JPEG data, based on a master clock signal MCLK. Also, the engine unit 240 may interface with the host/application 250 via a serial peripheral interface (SPI) and/or an inter-integrated circuit ($I^2C$).

Figure 12:
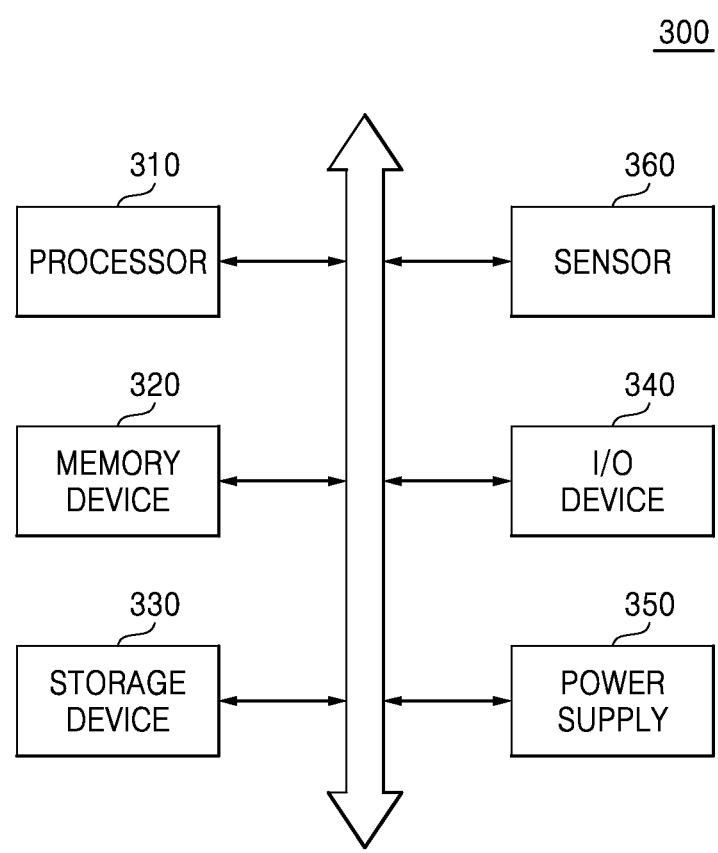
FIG. 12 is a block diagram of a computational system according to certain embodiments of the inventive concept.

FIG. 12 is a block diagram of a computational system 300 according to certain embodiments of the inventive concept.

The computational system 300 includes a processor 310, a memory device 320, a storage device 330, an I/O (input/output) device, a power supply 350 and an image sensor 360. The image sensor 360 may be the image sensor described in FIG. 1 through FIG. 10.

Although it is not shown in FIG. 12, the computational system 300 may further include a video card, a sound card, a memory card, and ports for communicating with a USB device or other electronic devises.

The processor 310 may perform predetermined calculations or tasks. According to some embodiments, the processor 310 may include a micro-processor, or a CPU (central processing unit). The processor 310 may communicate with the memory device 320, the storage device 330 and the I/O device via an address bus, a control bus and a data bus. According to some embodiments, the processor 310 may be connected to an expansion bus such as a PCI (Peripheral Component Interconnect) bus.

The memory device 320 may be used to store data necessary for operations of the computational system 300. For example, the memory device 320 may be implemented by a dynamic random access memory (DRAM), a mobile DRAM, a static RAM (SRAM), a phase change RAM (PRAM), a ferroelectric RAM (FRAM), a resistive RAM (RRAM or ReRAM) and/or a magnetic RAM (MRAM).

The storage device 330 may include a solid state drive (SSD), a hard disk drive (HDD), and/or a CD-ROM.

The I/O device 340 may include an input device such as a keypad, a keyboard, a touch pad or a computer mouse, and an output device such as a printer or a display.

The power supply 350 may be used to provide operating voltage necessary for operations of the computational system 300.

The image sensor 360 may be connected to and communicate with the processor 310 via the buses or other communication link. The image sensor 360 may be integrated in one chip with the processor 310 or may be implemented as a separate chip.

The computational system 300 may be any computational system using the image sensor 360. For example, the computational system 300 may include a digital camera, a cellular phone, a personal digital assistant (PDA), a portable multimedia player (PMP) or a smart phone.

Figure 13:
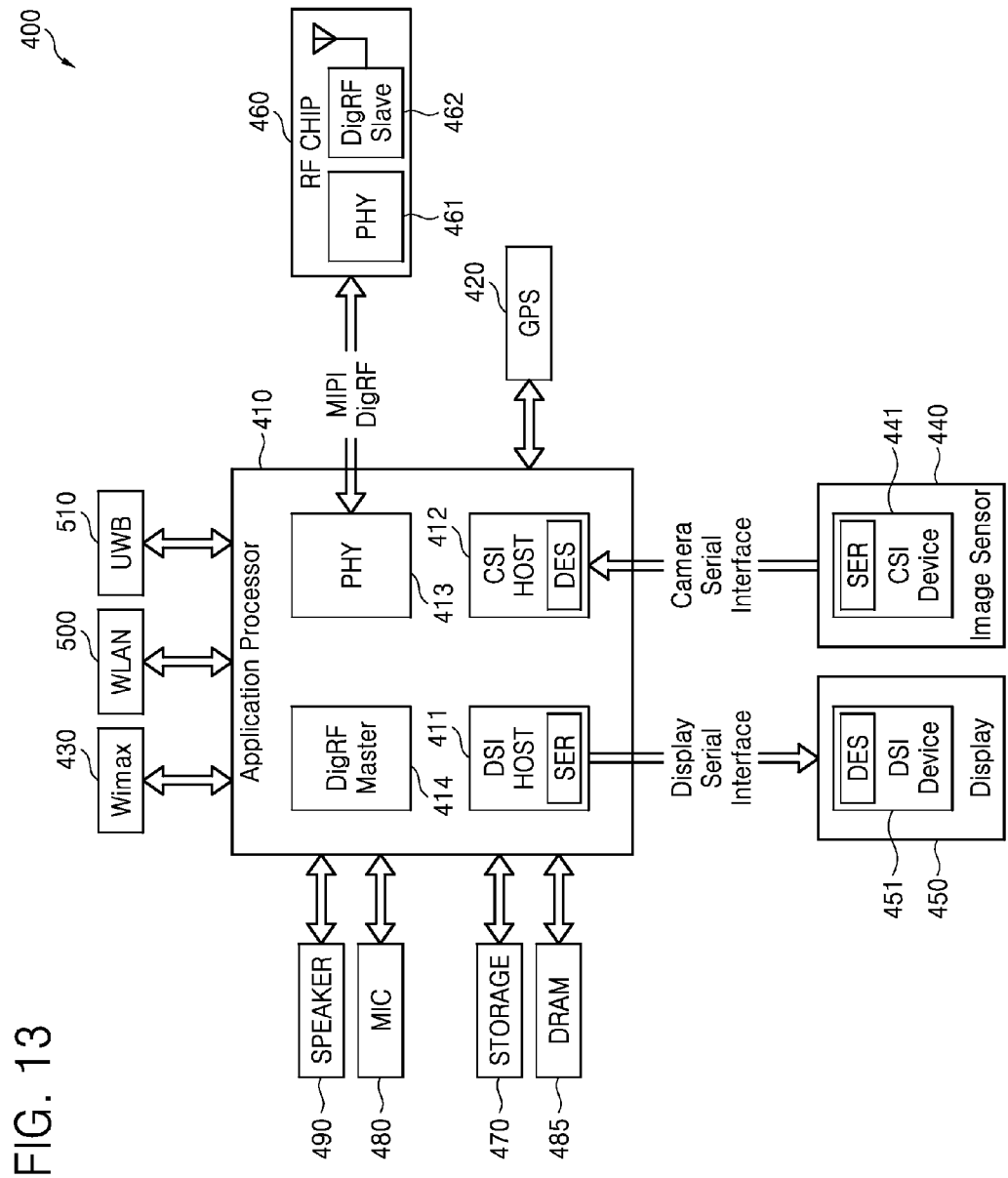
FIG. 13 further illustrates certain interfaces that may be associated with the computational system of FIG. 12.

FIG. 13 further illustrates certain interfaces that may be incorporated within the computational system of FIG. 12. Referring to FIG. 13, the computational system 400 may be implemented as a data processing apparatus capable of supporting a MIPI interface. The computational system 400 includes an application processor (AP) 410, an image sensor 440, and a display 450.

A CSI host 412 included in the application processor 410 performs serial communication with a CSI device 441 included in the image sensor 440 through CSI. According to some embodiments, the CSI host 412 may include a de-serializer (DES), and the CSI device 441 may include a serializer (SER).

A DSI host 411 included in the application processor 410 performs serial communication with a DSI device 451 included in the display 450 through DSI. According to some embodiments, the DSI host 411 may include a serializer (SER), and the DSI device 451 may include a de-serializer (DES).

The computational system 400 may also include a radio frequency (RF) chip 460 which communicates with the application processor 410. A physical layer (PHY) 413 of the computational system 400 and a PHY of the RF chip 460 communicate data with each other according to a MIPI DigRF standard. The computational system 400 may further include a DigRF mater 414 controlling data transmission according to a MIPI DigRF standard.

The computational system 400 may further include at least one element among a GPS 420, a storage device 470, a microphone 480, a DRAM 485 and a speaker 490. Furthermore, the computational system 400 may communicate using UWB (Ultra WideBand) 510, WLAN (Wireless Local Area Network) 500 and WIMAX (Worldwide Interoperability for Microwave Access) 430, A CDS circuit, an ADC, and an image sensor including same according to embodiments of the inventive concept are generally capable of changing points in time at which output signal logic levels apparent in comparison circuits change. This is accomplished by the use of a dithering operation that reduces the number of simultaneous output signal transitions for comparing circuits to thereby reduce fluctuation (s) in common signals. This improves overall image quality.

While the inventive concept has been particularly shown and described with reference to exemplary embodiments thereof, it will be understood that various changes in form and details may be made therein without departing from the scope of the following claims.

What is claimed is:

1. A correlated double sampling (CDS) circuit comprising:
a first input terminal that receives a ramp signal comprising a first ramp section and a second ramp section different from the first ramp section, a second input terminal that receives a pixel signal, and an output terminal that provides an output signal; and
a comparing circuit connected between the first and second input terminals and the output terminal, receiving a dithering enable signal, and configured to compare the ramp signal with the pixel signal to generate the output signal, wherein the comparing circuit is further configured to change a point in time at which the output signal logically transitions during the first ramp section and the second ramp section in response to the dithering enable signal.

2. The CDS circuit of claim 1, wherein the ramp signal further comprises an auto-zero section, and the comparing circuit comprises:
a first comparator that compares the ramp signal and the pixel signal to generate a first comparison signal and provides the first comparison signal at a first node, wherein the first comparator comprises a first non-inversion input terminal connected to the first input terminal, a first inversion input terminal connected to the second input terminal, and a first comparison output terminal connected to the first node;
a second comparator that amplifies the first comparison signal to generate the output signal, wherein the second comparator comprises a second non-inversion input terminal connected to the first node, a second inversion input terminal connected to a second node, and a second comparison output terminal connected to the output terminal, wherein at least one of the first comparator and the second comparator comprises an offset controller that controls the change in the point in time in response to the dithering enable signal;

a first capacitor connected between the second input terminal and the first inversion input terminal, such that the first capacitor stores a voltage difference between the ramp signal and the pixel signal during the auto-zero section; and a second capacitor connected between the second node and ground, such that the second capacitor stores an auto-zero voltage during the auto-zero section.

3. The CDS circuit of claim 2, wherein the comparing circuit further comprises:

a first switch connected between the first inversion input terminal and the first node, wherein the first switch is closed during the auto-zero section to feed back the first comparison signal to the first inversion input terminal;

a second switch connected between the second node and the output terminal, wherein the second switch is closed during the auto-zero section to feed back the output signal to the second inversion input terminal; and a third switch connected in series with the first capacitor, such that the third switch controls provision of the pixel signal to the first comparator.

4. The CDS circuit of claim 2, wherein the first comparator comprises a differential amplifier comprising:

a first power supply line that receives a first reference voltage;

a second power supply line that receives a second reference voltage;

a current source connected between the first power supply line and a third node;

a first transistor connected between the third node and a fourth node and having a gate connected to the first inversion input terminal;

a second transistor connected between the third node and a fifth node and having a gate connected to the first non-inversion input terminal;

a third transistor connected between the fourth node and a sixth node and having a gate that receives a cascode reference voltage;

a fourth transistor connected between the fifth node and a seventh node and having a gate that receives the cascode reference voltage;

a fifth transistor connected between the sixth node and the second power supply line and having a gate connected to the sixth node; and a sixth transistor connected between the seventh node and the second power supply line and having a gate connected to the sixth node.

5. The CDS circuit of claim 4, wherein the offset controller comprises:

a first offset transistor connected between the second power supply line and an eighth node, the first offset transistor having a gate that receives a bias voltage; and a second offset transistor connected between the eighth node and the seventh node, the second offset transistor having a gate that receives the dithering enable signal.

6. The CDS circuit of claim 2, wherein the second comparator comprises a differential amplifier comprising:

a first power supply line that receives a first reference voltage;

a second power supply line that receives a second reference voltage;

a current source connected between the first power supply line and a third node;

a first transistor connected between the third node and a fourth node and having a gate connected to the second inversion input terminal;

a second transistor connected between the third node and a fifth node and having a gate connected to the second non-inversion input terminal;

a third transistor connected between the fourth node and a sixth node and having a gate that receives a cascode reference voltage;

a fourth transistor connected between the fifth node and a seventh node and having a gate that receives the cascode reference voltage;

a fifth transistor connected between the sixth node and the second power supply line and having a gate connected to the sixth node; and a sixth transistor connected between the seventh node and the second power supply line and having a gate connected to the sixth node.

7. The CDS circuit of claim 6, wherein the offset controller comprises:

a first offset transistor connected between the second power supply line and an eighth node, the first offset transistor having a gate that receives a bias voltage; and a second offset transistor connected between the eighth node and the seventh node, the second offset transistor having a gate that receives the dithering enable signal.

8. The CDS circuit of claim 1, wherein the comparing circuit comprises an offset controller that operates during the first ramp section and the second ramp section to change the point in time in response to the dithering enable signal.

9. The CDS circuit of claim 2, wherein the offset controller operates during the auto-zero section to change a voltage stored in at least one of the first capacitor and the second capacitor in response to the dithering enable signal.

10. The CDS circuit of claim 1, wherein the comparing circuit comprises an offset controller that controls the change in the point in time in accordance with random noise.

11. The CDS circuit of claim 1, wherein the comparing circuit comprises an offset controller that controls the change in the point in time in response to one of a plurality of predetermined offsets.

12. The CDS circuit of claim 1, wherein the comparing circuit comprises:

a first comparator configured as a preamplifier to compare the ramp signal and the pixel signal, generate a first comparison signal, and provide the first comparison signal to the first node, wherein the first comparator comprises; a first non-inversion input terminal connected to the first input terminal, a first inversion input terminal connected to the second input terminal, and a first output terminal connected to the first node; and a second comparator configured as a trans-conductance amplifier to amplify the first comparison signal to provide the output signal, wherein the second comparator comprises; a second non-inversion input terminal connected to the first node, a second inversion input terminal connected to ground, and a second output terminal connected to the output terminal, wherein at least one of the first comparator and the second comparator comprises an offset controller that changes the point in time in response to the dithering enable signal.

13. An image sensor comprising:
a pixel array that provides a pixel signal;
a ramp signal generator that provides a ramp signal including a first ramp section and a second ramp section different from the first ramp section; and
an analog-digital converter (ADC) including a plurality of correlated double sampling (CDS) circuits,
wherein each CDS circuit in the plurality of CDS circuits comprises:
a first input terminal that receives the ramp signal, a second input terminal that receives the pixel signal, and an output terminal that provides an output signal; and
a comparing circuit connected between the first and second input terminals and the output terminal, receiving a dithering enable signal, and configured to compare the ramp signal with the pixel signal to generate the output signal and change a point in time at which the output signal logically transitions during the first ramp section and the second ramp section in response to the dithering enable signal.

14. The image sensor of claim 13, wherein the ADC is a single slope, column-parallel ADC.

15. The image sensor of claim 14, wherein respective points in time at which corresponding output signals in adjacent columns of the pixel array change are different from one another.

16. The image sensor of claim 13, wherein the comparing circuit comprises an offset controller that changes the point in time in accordance with random noise.

17. The image sensor of claim 15, wherein the comparing circuit comprises an offset controller that changes the respective points in time in accordance with a plurality of corresponding offsets.

18. The image sensor of claim 13, wherein the ramp signal further comprises an auto-zero section, and each CDS circuit comprises:
a first comparator that compares the ramp signal and the pixel signal to generate a first comparison signal and provides the first comparison signal at a first node, wherein the first comparator comprises a first non-inversion input terminal connected to the first input terminal, a first inversion input terminal connected to the second input terminal, and a first comparison output terminal connected to the first node;
a second comparator that amplifies the first comparison signal to generate the output signal, wherein the second comparator comprises a second non-inversion input terminal connected to the first node, a second inversion input terminal connected to a second node, and a second comparison output terminal connected to the output terminal,
wherein at least one of the first comparator and the second comparator comprises an offset controller that controls the change in the point in time in response to the dithering enable signal;
a first capacitor connected between the second input terminal and the first inversion input terminal, such that the first capacitor stores a voltage difference between the ramp signal and the pixel signal during the auto-zero section; and
a second capacitor connected between the second node and ground, such that the second capacitor stores an auto-zero voltage during the auto-zero section.

19. The image sensor of claim 18, wherein the comparing circuit further comprises:
a first switch connected between the first inversion input terminal and the first node, wherein the first switch is closed during the auto-zero section to feed back the first comparison signal to the first inversion input terminal;
a second switch connected between the second node and the second inversion input terminal of the second comparator, wherein the second switch is closed during the auto-zero section to feed back the output signal to the second inversion input terminal; and
a third switch connected in series with the first capacitor, such that the third switch controls provision of the pixel signal to the first comparator.

20. A computational system comprising:
a processor controlling operation of an image sensor, the image sensor comprising:
a pixel array that provides a pixel signal;
a ramp signal generator that provides a ramp signal including a first ramp section and a second ramp section different from the first ramp section; and
an analog-digital converter (ADC) including a plurality of correlated double sampling (CDS) circuits,
wherein each CDS circuit in the plurality of CDS circuits comprises:
a first input terminal that receives the ramp signal, a second input terminal that receives the pixel signal, and an output terminal that provides an output signal; and
a comparing circuit connected between the first and second input terminals and the output terminal, receiving a dithering enable signal, and configured to compare the ramp signal with the pixel signal to generate the output signal and change a point in time at which the output signal logically transitions during the first ramp section and the second ramp section in response to the dithering enable signal.

* * * * *